(12) United States Patent
Chantre et al.

(10) Patent No.: US 7,122,879 B2
(45) Date of Patent: Oct. 17, 2006

(54) BIPOLAR TRANSISTOR WITH HIGH DYNAMIC PERFORMANCES

(75) Inventors: Alain Chantre, Seyssins (FR); Bertrand Martinet, Grenoble (FR); Michel Marty, Le Meinget (FR); Pascal Chevalier, Chapareillan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/942,165

(22) Filed: Sep. 16, 2004

(65) Prior Publication Data

US 2006/0054998 A1 Mar. 16, 2006

(30) Foreign Application Priority Data

Sep. 17, 2003 (FR) .................................. 03 50553

(51) Int. Cl.
*H01L 27/02* (2006.01)
*H01L 29/70* (2006.01)
*H01L 31/11* (2006.01)

(52) U.S. Cl. ..................... 257/565; 257/578; 257/573; 257/575

(58) Field of Classification Search ......... 257/565–593
See application file for complete search history.

(56) References Cited

U.S. PATENT DOCUMENTS

| 6,563,147 | B1 | 5/2003 | Ikeda |
| 6,806,524 | B1 * | 10/2004 | Ooishi ........................ 257/295 |
| 2002/0061627 | A1 | 5/2002 | Kovacic |
| 2002/0158313 | A1 * | 10/2002 | Takagi et al. ................ 257/593 |
| 2003/0132453 | A1 | 7/2003 | Greenberg et al. |

FOREIGN PATENT DOCUMENTS

EP 1 207 562 A 5/2002

OTHER PUBLICATIONS

French Search Report from French Patent Application 03/50553 filed Sep. 17, 2003.
Iranmanesh A.A. et al. "A 0.8-UM Advanced Single-Poly BICMOS Technology For High-Density and High-Performance Applications" IEEE Journal of Solid-State Circuits, IEEE Inc., New York, US, vol. 26, No. 3, Mar. 1, 1991, pp. 422-426, XP000222622.
Yang W.L. et al. "Barrier Capability Of TaNx films depsoited by different nitrogen flow rate against Cu diffusion in Cu/TaNx/n-p junction diodes" Solid State Electronics, Elsevier Science Publishers, Barking, GB, vol. 45, No. 1, Jan. 1, 2001, pp. 149-158, XP004313667.
Sato F. et al. "Sub-20 psec ECL circuits with 50 GHz fmax self-aligned SiGe HBTs" Electron Devices Meeting, 1992. Technical Digest, International San Francisco, CA, USA Dec. 13-16, 1992, New York, NY, USA, IEEE, US, Dec. 13, 1992, pp. 397-400, XP0106468.
Iyer S.S. et al. "Heterojunction Bipolar Transistors Using SI-GE Alloys" IEEE Transactions on Electron Devices, IEEE Inc. New York, US, vol. 36, No. 10, Oct. 1, 1989, pp. 2043-2064, XP000095523.

(Continued)

*Primary Examiner*—Cuong Nguyen
(74) *Attorney, Agent, or Firm*—Lisa K. Jorgenson; James H. Morris; Wolf, Greenfield & Sacks, P.C.

(57) ABSTRACT

A bipolar transistor with very high dynamic performance, usable in an integrated circuit. The bipolar transistor has a single-crystal silicon emitter region with a thickness smaller than 50 nm. The base of the bipolar transistor is made of an SiGe alloy.

6 Claims, 5 Drawing Sheets

OTHER PUBLICATIONS

Hiroyuki Hirayama et al. "Heterojunction Bipolar Transistor Fabrication Using SII-XGEX Selective Epitaxial Growth by Gas Source Silicon Molecular Beam Epitaxy" Applied Physics Letters, American Institute of Physics, New York, US, vol. 56, No. 26, Jun. 25, 1990, pp. 2645-2647, XP000150020.

European Search Report from corresponding European Application No. 04104491.

Yang W.L. et al. *Barrier Capability OF TaNx films depsoited by different nitrogen flow rate against Cu diffusion in Cu/TaNx/n-p junction diodes*, Solid State Electronics, Elsevier Science Publishers, Barking, GB, vol. 45, No. 1, Jan. 1, 2001, pp. 149-158, XP004313667 (Previously submitted).

Tze-Chiang Chen et al: *An Advanced Bipolar Transistors With Self-Aligned Ion-Implanted Base and W/Poly Emitter*, IEEE Transactions on Electron Devices, IEEE Inc. New York, vol. 35, No. 8, Aug. 1, 1988, pp. 1322-1327, XP000030550.

\* cited by examiner

BIPOLAR TRANSISTOR WITH HIGH DYNAMIC PERFORMANCES

BACKGROUND OF THE INVENTION

1. Field of the Invention

The present invention relates to the field of microelectronics, and more specifically to a bipolar transistor and to its implementation.

2. Discussion of the Related Art

Bipolar transistors used as integrated circuit components especially those integrated with MOS transistors in integrated circuits of Bi-CMOS type will more specifically be considered herein.

Integrated circuits with increasingly high performance are developed. To achieve this, all components must be optimized. Bipolar transistors are used because of their dynamic performance which enable their use in the field of very high frequencies, greater than 50 GHz.

A conventional NPN-type transistor is schematized in FIG. 1. It comprises an N-type doped single-crystal silicon collector region 1, a P-type doped single-crystal silicon base region 2, and an N-type doped single-crystal silicon emitter region 3. The collector is formed in a silicon substrate, the base region is formed above the collector region. The emitter region is formed inside of the base region, for example, by diffusion of dopant atoms. A metal 4 is deposited on emitter region 3 to ensure an electric contact on this region. The operation of this bipolar transistor is the following. A control current Ib is injected between the base region and the emitter region and a collector current Ic usable in electronic circuits results therefrom, according to the biasing conditions of the collector region. Collector current Ic is a desired current and base current Ib is a parasitic current. Ratio Ic/Ib, which is the current gain of the bipolar transistor, is a figure of merit that those skilled in the art attempt to increase to obtain values greater than 60. A very large number of technological parameters modify the bipolar transistor gain. If metal 4 is close to the base-emitter junction, a significant base current is created by recombining the minority carriers located close to this junction. Thus, if base current Ib is desired to be decreased, it is necessary to increase the distance between metal 4 and base region 2. In other words, it is necessary to have an emitter with a thickness greater than several times the diffusion length of the minority carriers present in this emitter region. Thus, conventional bipolar transistors have an emitter thickness greater than 800 nm. The presence of metal is not the only parameter with an influence on the gain. The parameters which modify the current gain of bipolar transistors are in a greater number, sometimes poorly understood and often poorly controlled. But it has been observed that an increase in the emitter thickness would always result in a better injection efficiency (increase of Ic) and in a smaller base current Ib.

Bipolar transistors are often used for their dynamic performance. For purely geometric reasons, the structure shown in FIG. 1 is a low-performance structure because of the capacitance present between the base and emitter regions. This capacitance is proportional to the surface area of the junction between the base and the emitter. Since the emitter extends deeply into the base, the contribution of the emitter periphery to the total capacitance between the base and emitter regions is significant while this region, distant from the base/collector junction, plays a reduced part in the bipolar transistor currents. To increase the dynamic performance of the bipolar transistor, bipolar transistors with a polysilicon emitter according to FIG. 2 have been formed.

The transistor of FIG. 2 comprises an N-type doped single-crystal silicon collector region 10 on which is formed a single-crystal silicon base region 20 in and on which is formed an emitter structure 30-35-40. Emitter 35 is made of N-type doped polysilicon and is prolonged, in base region 20, by an N-type diffused region 30. A metal 40 rests on emitter 35. The thickness of single-crystal silicon portion 30 of the emitter is approximately 100 nm and the thickness of polysilicon portion 35 of the emitter is approximately 600 nm. Portion 30 of the emitter has a preponderating contribution for the stray capacitance between the emitter and the base region of the bipolar transistor. The small depth of portion 30 results in that this stray capacitance is greatly reduced with respect to the case of FIG. 1, although the general emitter thickness is similar for the cases of FIGS. 1 and 2.

SUMMARY OF THE INVENTION

An object of the present invention is to provide a bipolar transistor with improved dynamic performance.

Another object of the present invention is to provide a bipolar transistor which is easily integrable in a Bi-CMOS process.

To achieve these and other objects, the present invention provides a bipolar transistor comprising a first single-crystal silicon collector region of a first conductivity type topped with a second silicon- and germanium-based single-crystal region of a second conductivity type, the base region containing a third emitter region of the first conductivity type located on the side opposite to the collector region and covered with a metal, in which the emitter region has a thickness smaller than 50 nm, preferably between 5 and 30 nm.

According to an embodiment of the present invention, the second region is formed, from the collector, of a first SiGe layer, the germanium concentration of which decreases from a value of approximately 30%, doped with boron at a concentration ranging between $10^{19}$ and $10^{20}$ at/cm$^3$, and of a second approximately 15-nm thick silicon layer.

According to an embodiment of the present invention, the metal is tungsten deposited on a layer containing titanium or titanium nitride.

According to an embodiment of the present invention, the metal is copper deposited on a layer containing tantalum or tantalum nitride.

The present invention also provides a method for forming a thin-emitter bipolar transistor, comprising the steps of:

forming by epitaxy on a single-crystal silicon substrate of a first conductivity type a base region of a thickness smaller than 100 nm of a second conductivity type and comprising germanium;

forming on the periphery of the base region a heavily-doped region of the second conductivity type covered with heavily-doped polysilicon of the second conductivity type;

forming in the central portion of the base and inside of a window not covered with the polysilicon a heavily-doped emitter region of the first conductivity type and having a thickness smaller than 50 nm and preferably ranging between 5 and 30 nm; and depositing a metal above the emitter.

According to an embodiment of the present invention, the base epitaxy method comprises at least two phases resulting in two successive layers: a first layer formed of a silicon and germanium alloy having its germanium concentration decreasing from a value of approximately 30% and having a dopant atom concentration ranging between $10^{19}$ and $10^{20}$ at/cm$^3$, and a second layer made of lightly-doped silicon.

According to an embodiment of the present invention, the emitter is formed by ion implantation in the window formed above the base in the polysilicon.

According to an embodiment of the present invention, the emitter is formed by diffusion of doping species contained in doped silicon through a native oxide layer.

According to an embodiment of the present invention, the step of metal deposition on the emitter comprises the following steps subsequent to the emitter diffusion: etching said doped silicon to delimit it laterally; depositing an insulator entirely covering said doped silicon; opening a passage through the insulator emerging on the doped silicon; completely eliminating said doped silicon through the passage; and filling the cavity thus created with a metal compound.

According to an embodiment of the present invention, the metal deposition comprises at least two layers, the first one comprising titanium or tantalum, the second one containing aluminum, tungsten, or copper.

The foregoing objects, features, and advantages of the present invention will be discussed in detail in the following non-limiting description of specific embodiments in connection with the accompanying drawings.

DETAILED DESCRIPTION

Figure 1:
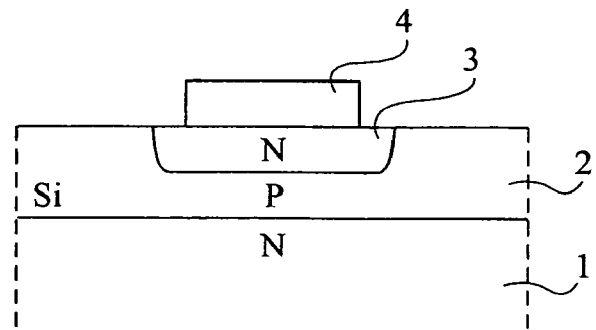
FIG. 1 shows a bipolar transistor according to prior art.
Figure 2:
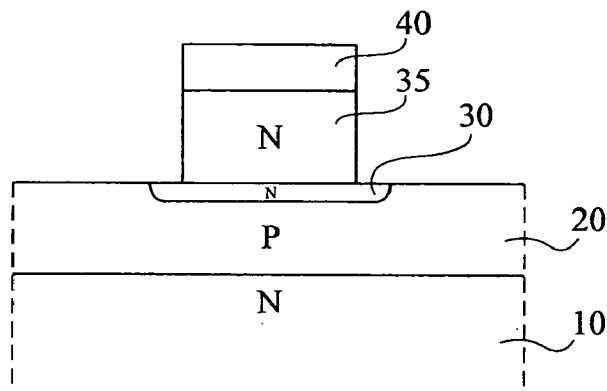
FIG. 2 shows another bipolar transistor type according to prior art.

As usual in the representation of integrated circuit devices, the scales are not respected to better show the different layers and elements of the devices.

According to the present invention, to increase the dynamic performance of a bipolar transistor, a bipolar transistor is used, the single-crystal silicon emitter of which has a thickness smaller than 50 nm. It is preferable, to optimize the dynamic performance, to use a thickness for the emitter region ranging between 5 and 30 nm.

Such a transistor, for example, of type NPN, comprises an N-type doped single-crystal silicon collector region on which is formed by epitaxial growth a single-crystal silicon base region in which is formed an emitter region. The base region is P-type doped, for example, with boron. At the surface of this base, and inside thereof, there exists a heavily-doped N-type region which forms the emitter region of the bipolar transistor. A metal rests on this emitter, forming a metal contact area.

According to the present invention, the base region is formed of two distinct layers. The first layer is a single-crystal epitaxial matrix on the collector region in which germanium is incorporated with a concentration profile ranging between 0 and 30%, a P-type dopant, for example, boron with a concentration ranging between $10^{19}$ and $10^{20}$ at/cm$^3$, and carbon. The thickness of the first layer is approximately 30 nm. The germanium concentration is not constant, it decreases towards the upper part of the first layer. The second layer is epitaxial single-crystal silicon on the first layer. The thickness of the second layer is smaller than approximately 50 nm. At least in the thickness of this second layer is the emitter formed.

It can be observed that by associating an emitter of reduced thickness with this base structure, the current gains are greater than 50, which is an acceptable value for high-performance dynamic bipolar transistors. The reduced thickness of the emitter causes a decrease in the current gain which is compensated for by the current gain increase due to the presence of germanium in the base. The current gain is determined by adjusting the emitter thickness and the germanium concentration in the base region.

The choice of an emitter thickness smaller than 50 nm has many favorable consequences for the bipolar transistor's dynamic performances. Three will be mentioned as an example, but this list is not exhaustive. First, the emitter resistance is decreased since the metal region is close to the base/emitter junction. Second, the carrier transit time in the emitter is also decreased. Third, the minority carrier storage phenomenon is limited in the emitter. During the device conduction, many minority carriers are injected into the emitter and then form a charge stored in this emitter. When the transistor switches to the off state, this charge must be eliminated, which is not instantaneous since it is formed of minority carriers. The lifetime of this charge depends on the number of stored carriers and on their lifetime. These two parameters are reduced to a minimum in the bipolar transistor according to the present invention.

The selection of an emitter thickness smaller than 50 nm also has a favorable consequence for the static performances of the bipolar transistor. The base doping is not only determined by the gain to be obtained, since this gain also depends on the emitter thickness. The base thickness and doping are determined independently from the current gain of the bipolar transistor. The base doping and thickness are then selected according to the other parameters of the bipolar transistor, for example, the breakdown voltage between the emitter and the collector of the bipolar transistor.

Figure 3:
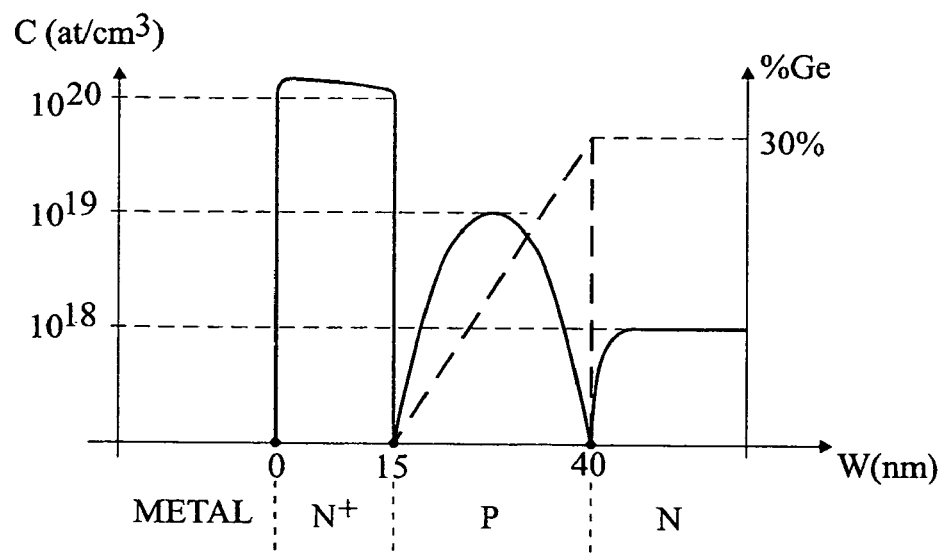
FIG. 3 shows an example of a doping profile of a bipolar transistor according to the present invention.

FIG. 3 illustrates an example of the dopant concentration profile according to depth at the level of the emitter/base/collector junctions of a transistor according to the present invention. Four regions are successively encountered: the metal, the single-crystal emitter, the base, and the collector. The region incorporating germanium has also been shown in FIG. 3, in dotted lines.

The metal ensures a contact on the emitter. Its thickness, for example, 200 nm, is sufficient to limit the resistance of access to the device. Any metal and any metal alloy may be suitable, provided that they do not penetrate into the emitter. The metal is formed, for example, of aluminum, tungsten or copper. According to cases, barrier layers are used, for example, titanium and titanium nitride in the case of aluminum or tungsten, tantalum nitride and tantalum in the case of copper. Any other barrier layer and any deposition method for the different metal layers may be used.

The emitter is very thin and heavily doped. Preferably, a thickness smaller than 50 nm is used, preferably between 5 and 30 nm. The doping, for example, with arsenic, is on the order of $10^{20}$ at/cm$^3$. The emitter thickness is a parameter for adjusting the current gain of the device. Its thinness determines the maximum electric performance. An advantage of a single-crystal silicon emitter over a polysilicon emitter can be mentioned. Conversely to the case of polysilicon, the roughness of the upper surface of single-crystal silicon is low and smaller than 3 nm. The emitter thickness can be controlled during the bipolar transistor manufacturing process with an accuracy smaller than 1 nm, which would not be possible in the case of a polysilicon emitter.

The base is formed of an SiGe alloy containing between 0 and 30% of germanium. The germanium profile is optimized. Preferably, the base has a thickness on the order of 25 nm. The doping, for example, with boron, ranges between $10^{19}$ and $10^{20}$ at/cm$^3$. Finally, carbon is incorporated. The thinness of the base and its small resistance are determining for the dynamic performances of the bipolar transistor.

The doping profile of the collector is optimized to increase the breakdown voltage of the base/collector junction and to reduce the resistance of access to the collector as well as the transit time of the carriers in the base/collector junction.

The desired aim is achieved by this type of bipolar transistor. The current gain is maintained above a minimum value 50 mainly by adjusting the emitter thickness and by optimizing the germanium profile in the base. The base/emitter capacitance is very small since the emitter penetrates little into the base. The vertical resistance of the emitter is reduced since the emitter thickness is smaller than 50 nm. Finally, the number of minority holes injected into the emitter volume is reduced by the emitter volume reduction. The evacuation of this charge will be very fast in case of device switching. Operating frequencies will be improved. Further, since the doping of the base as well as the current of the bipolar transistor are reduced, the breakdown voltage between the emitter and the collector will be improved and may reach 5 V.

Two methods for forming, according to the present invention, bipolar transistors with optimized performances are provided. The first method describes the forming of a so-called quasi-self-aligned bipolar transistor. The second one describes the forming of a so-called self-aligned bipolar transistor.

Quasi-Self-aligned Method

Figure 4A:
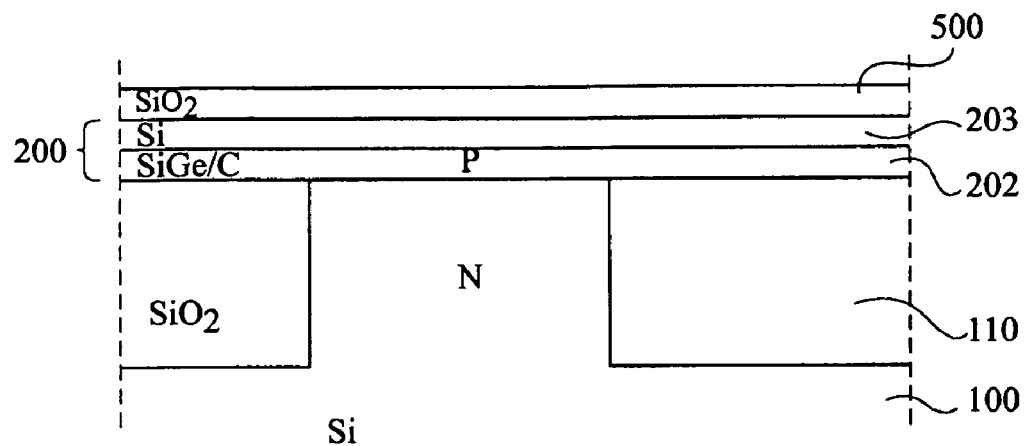
FIGS. 4A to 4D show successive steps of the manufacturing of a bipolar transistor according to a first embodiment of the present invention.

FIG. 4A shows the initial steps of the forming of a quasi-self-aligned bipolar transistor. In an initial N-type single-crystal silicon substrate 100, shallow trenches 110 filled with an insulator are formed. These shallow trenches define active areas emerging at the substrate surface. A deposition of base region 200 is performed over the entire substrate surface so that it is a single-crystal substrate on the active areas and a polycrystalline substrate above the filled shallow trenches. Preferably, deposition 200 is formed of two successive layers 202, 203. Layer 203 is silicon, layer 202 is an SiGe alloy containing carbon and boron. The germanium concentration profile in layer 202 is not constant, it preferably has a triangular shape decreasing towards the surface. Boron is introduced in the deposition step, carbon is implanted after forming of layer 200. An oxide layer 500 with a 20-nm thickness is then deposited over the entire structure.

Figure 4B:
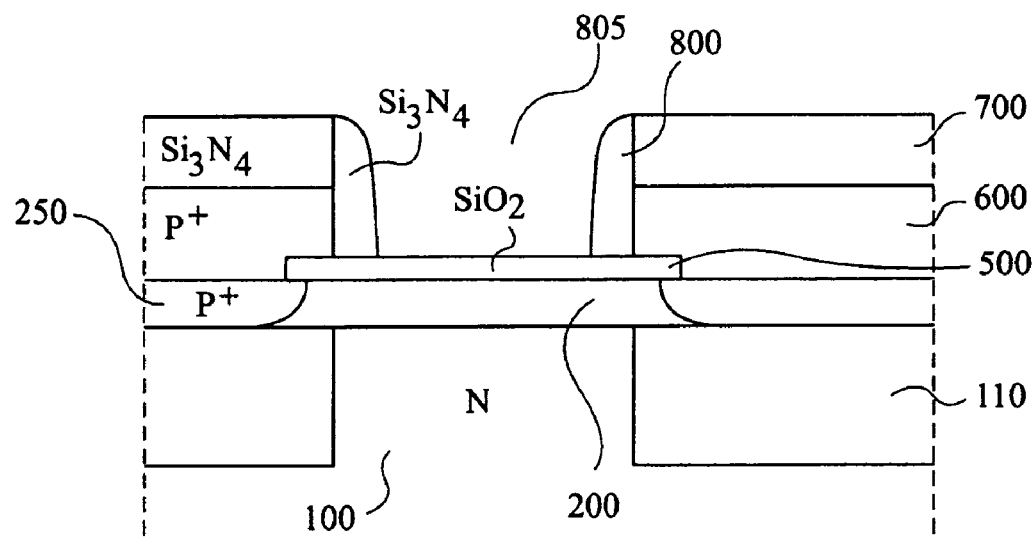

FIG. 4B shows the next steps of the forming of the quasi-self-aligned bipolar transistor. Oxide layer 500 is etched to leave an oxide pellet approximately located above the single-crystal region of layer 200. A polysilicon layer 600 with a 100-nm thickness heavily doped with boron, approximately $10^{20}$ at/cm$^3$ is deposited. A 50-nm nitride layer 700 is then deposited over the entire structure. Nitride layer 700 and polysilicon layer 600 are then etched to form an open window 805 with no nitride and no polysilicon above and inside of oxide pellet 500. Nitride spacers 800 are formed on the sides of window 805. The width of these spacers for example is 30 nm. At this stage, polysilicon 600 is completely isolated from window 805 and in contact with base 200. An anneal enables performing a diffusion of the dopant from the polysilicon to the base region to form a heavily-doped P-type extrinsic base region 250 ensuring the electric contact between P-type base 200 and P-type polysilicon 600. During this anneal, a diffusion of the boron contained in layer 202 occurs towards layer 203.

Figure 4C:
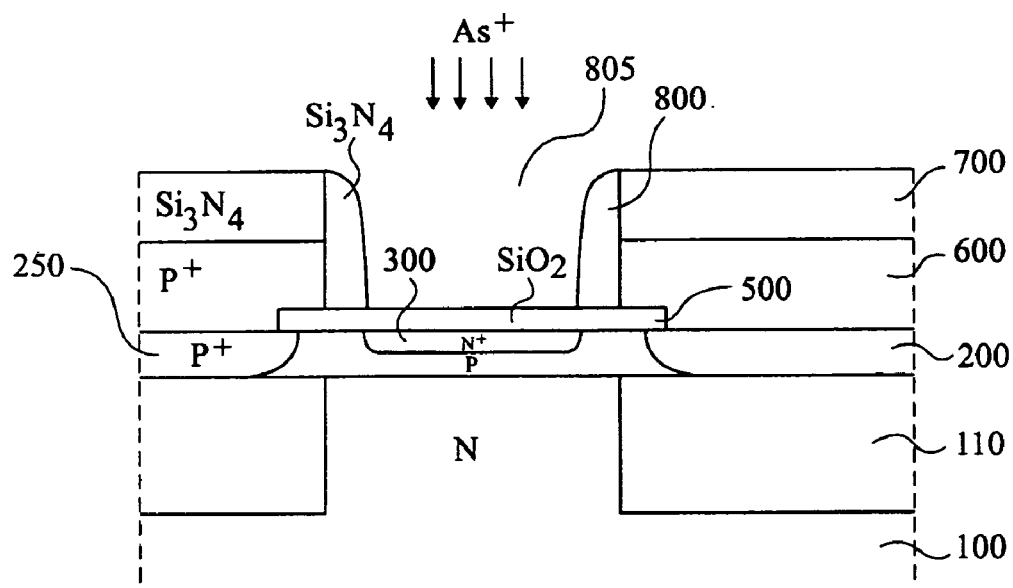

FIG. 4C shows the next steps of the forming of the quasi-self-aligned bipolar transistor. Arsenic ions are implanted in window 805 to create a heavily-doped N-type region 300 in base region 200, substantially in previously-described region 203. This implantation is preferably performed through oxide layer 500. This ion implantation may also be performed after having removed the oxide from within window 805. The implantation power is on the order of 10 keV and the dose is on the order of $5.10^{15}$ at/cm$^2$.

Figure 4D:
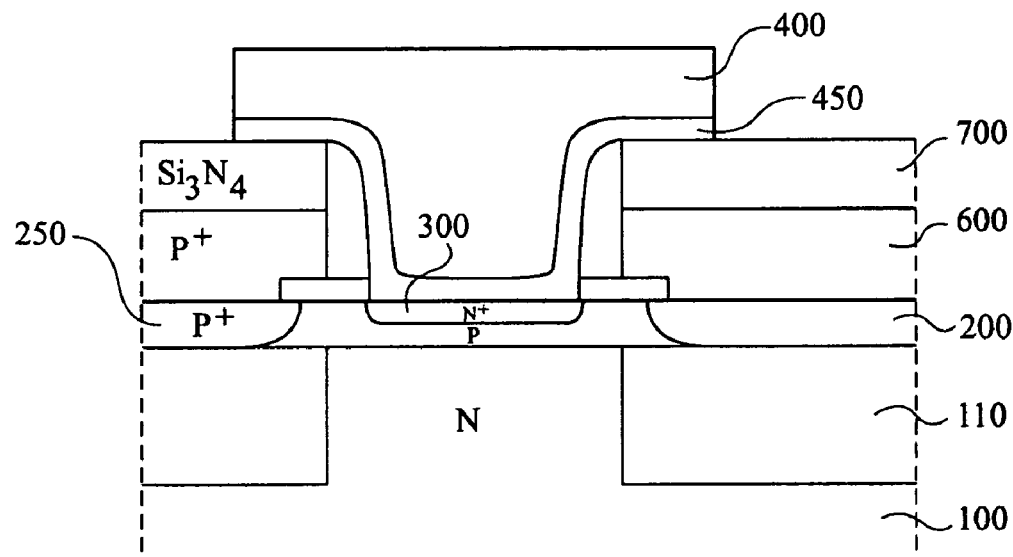

FIG. 4D shows the next steps of the forming of the quasi-self-aligned bipolar transistor. Emitter window 805 is cleaned and, inside of this window, the silicon surface of emitter 300 is exposed. A first titanium and titanium nitride metal layer 450, followed by a metal layer 400, for example, an alloy of aluminum and silicon at 2%, are deposited, after which these layers are delimited by etching. In an embodiment, the thickness of layer 450 is 20 nm, and that of layer 400 is 300 nm.

Self-aligned Method

Figure 5A:
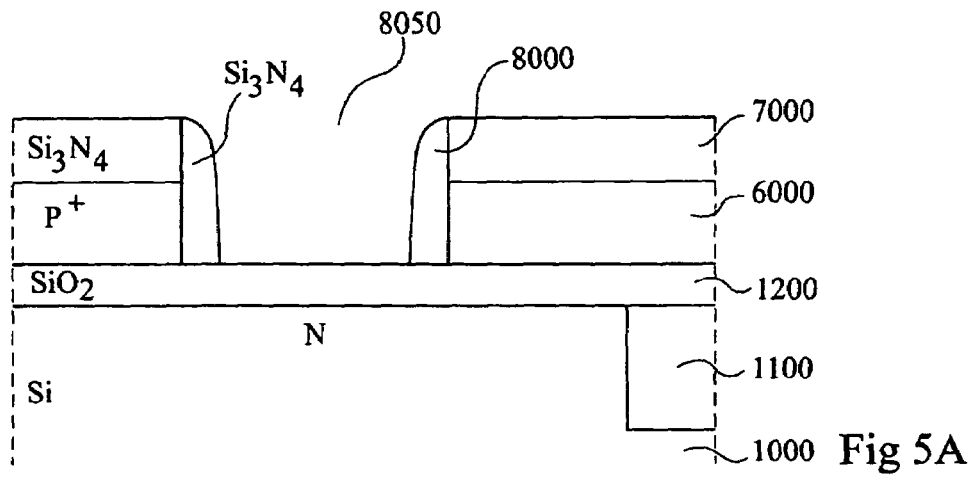
FIGS. 5A to 5E show successive steps of the manufacturing of a bipolar transistor according to a first embodiment of the present invention.

FIG. 5A shows initial steps of the forming of a self-aligned bipolar transistor. In an initial N-type single-crystal silicon substrate 1000, shallow trenches 1100 filled with an insulator are conventionally formed. A silicon oxide layer 1200 with a 50-nm thickness is then deposited. A P-type polysilicon layer 6000 with a 100-nm thickness, heavily doped with boron, approximately $10^{20}$ at/cm$^3$ is deposited. A 50-nm nitride layer 7000 is then deposited over the entire structure. Nitride layer 7000 and polysilicon layer 6000 are then etched to leave an open window 8050 emerging above oxide layer 1200. Nitride spacers 8000 are conventionally formed on the sides of window 8050. The width of these spacers is 30 nm. At this stage, polysilicon 6000 is completely isolated from window 8050 and from substrate 1000.

Figure 5B:
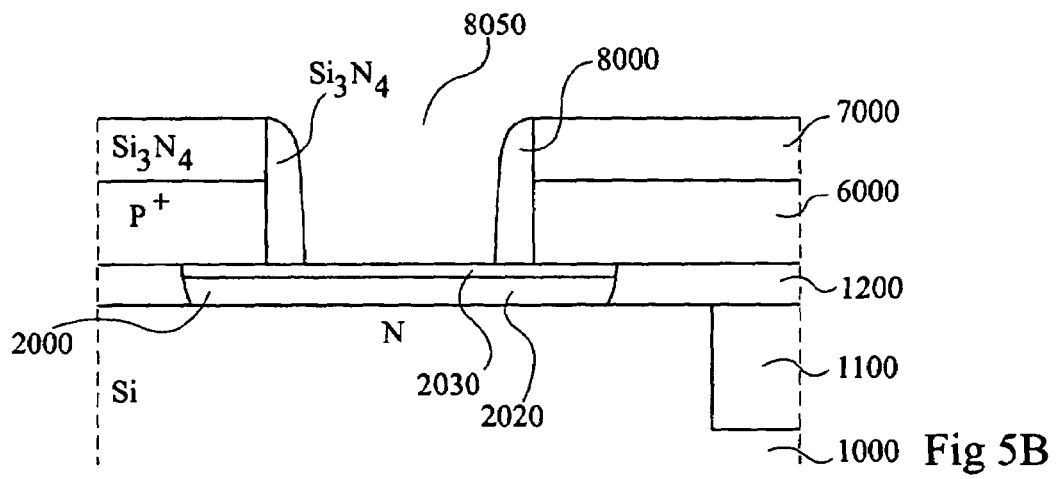

FIG. 5B shows the next steps of the forming of a self-aligned bipolar transistor. Oxide layer 1200 is isotropically etched, through window 8050. A hydrous solution containing hydrofluoric acid is for example used. This solution is very selective with respect to the other layers in presence and practically does not etch nitride and polysilicon. This isotropic etching of oxide 1200 is carried on to expose a portion of oxide 1200 underlying polysilicon 6000 on the periphery of window 8050 and over a distance of approximately 200 nm. At this stage, there is a cavity in oxide layer 1200 limited in its lower part by the silicon of substrate 1000, in its lateral parts by oxide 1200, and in its upper parts by polysilicon 6000 and nitride 8000. This cavity can be accessed to through window 8050. The deposition of base region 2000 is then performed. Preferably, this deposition 2000 is formed of two successive layers 2020, 2030. Layer 2030 is silicon, layer 2020 is an SiGe alloy containing carbon and boron. The germanium concentration profile in layer 2020 is not constant, it preferably has a triangular shape decreasing towards the surface. The maximum of the germanium concentration is approximately 30%. The boron and the carbon are introduced during the deposition step. The method used for the deposition of base region 2000 is selective. Layer 2000 grows only on the substrate 1000 and on the polysilicon 6000 exposed by the cavity. This is also an epitaxial deposition: base region 2000 is a single-crystal region when it grows from single-crystal substrate 1000.

Figure 5C:
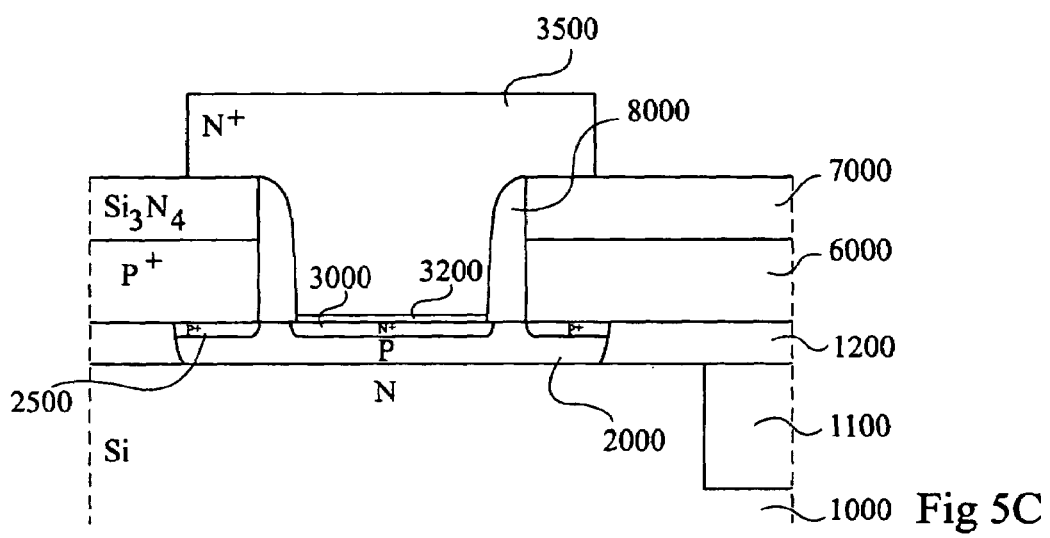

FIG. 5C shows the next steps of the forming of a self-aligned bipolar transistor. An anneal enables performing a diffusion of the dopant of polysilicon 6000 towards underlying base region 2000 to form a heavily-doped P-type extrinsic base region 2500 ensuring the electric contact between P-type base 2000 and P-type polysilicon 6000. An N-type polysilicon layer 3500 heavily doped with arsenic is deposited. In window 8050, this deposition is not in direct contact with base region 2000, but is separated therefrom by a native oxide 3200 having a thickness ranging between 0.5 and 2 nm. The control of the quality and of the thickness of this native oxide is performed by the type of cleaning performed before deposition of layer 3500. Layer 3500 is etched to leave a polysilicon pad coming out on all sides of window 8050. A fast anneal of a few tens of seconds at 1000° C., enables penetration of the arsenic atoms from polysilicon 3500 into base 2000 to form an emitter region 3000, through native oxide layer 3200.

Figure 5D:
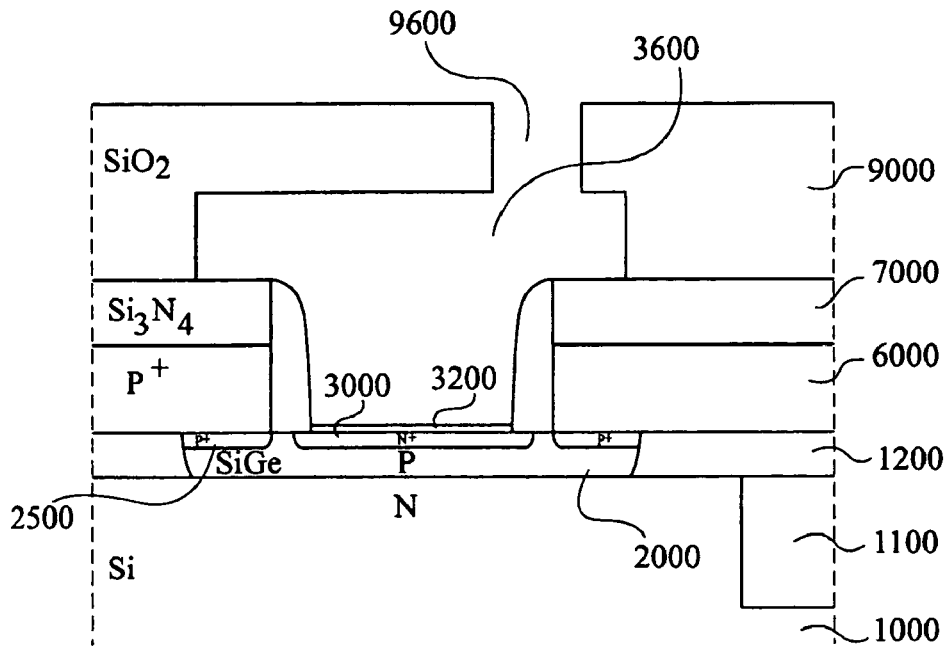

FIG. 5D shows the next steps of the forming of a self-aligned bipolar transistor. An oxide 9000 with a 500-nm thickness is deposited. A planarization step enables obtaining a planar upper surface for oxide 9000. An access shaft 9600 emerging at the surface of layer 3500 is opened above this layer. By selective chemical etch, all the accessible silicon is removed, stopping the etch on oxide layer 3200. At this stage of the method, there exists a cavity above the emitter region limited by oxide 3200, nitride spacers 8000, nitride insulation layer 7000, and oxide 9000. This cavity emerges outside through shaft 9600. In the case of an integrated circuit comprising other types of elements requiring many other technological steps, this cavity may be formed at the end of the manufacturing process and in particular during one of the interconnect forming steps.

Figure 5E:
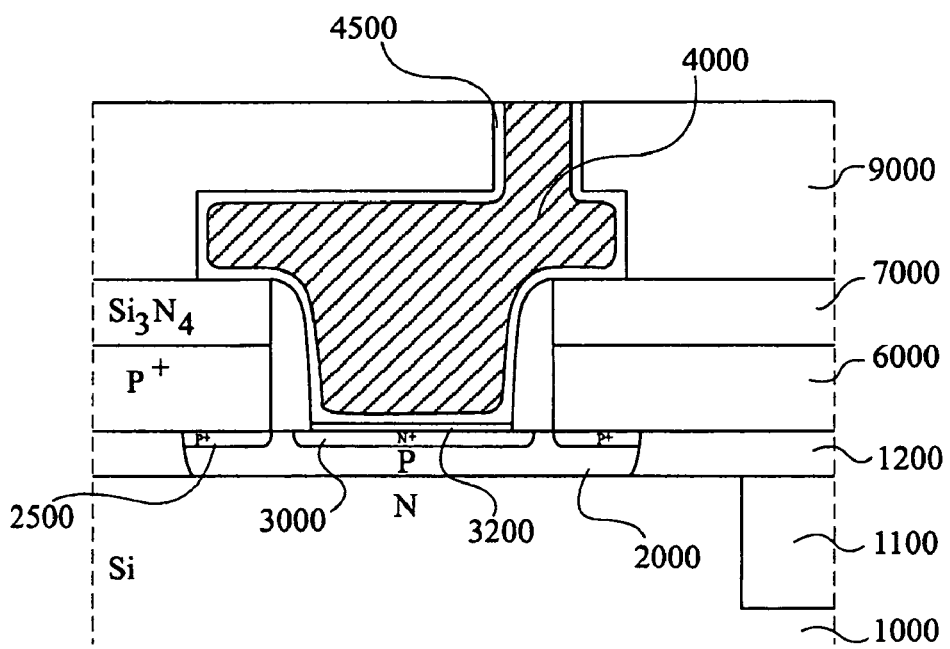

FIG. 5E shows the next steps of the forming of a self-aligned bipolar transistor. A first titanium and titanium nitride layer 4500 is isotropically deposited in a conventional way in the previously-created cavity. Tungsten 4000 is then deposited by a CVD (chemical vapor deposition) method to isotropically fill this cavity. Aluminum may also be deposited by an ALD (atomic layer deposition) method.

A copper-based contact may also be formed by using a tantalum nitride barrier layer and by growing electrolytic copper. A second planarization step enables removing any metal deposited above oxide layer 9000.

Although various materials, thicknesses, and deposition or etch modes have been indicated hereabove as an example, it should be clear that those skilled in the art may bring various alterations and modifications thereto, while remaining within the scope of the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bipolar transistor comprising a first single-crystal silicon collector region of a first conductivity type topped with a second silicon- and germanium-based single-crystal base region of a second conductivity type, the base region containing, in its upper portion, an emitter region of the first conductivity type, the emitter region having a thickness smaller than 50 nm and being in contact with a metal.

2. The bipolar transistor of claim 1, wherein the second region is formed, from the collector, of a first SiGe layer, the germanium concentration of which decreases from a value of approximately 30%, doped with boron at a concentration ranging between $10^{19}$ atoms/cm$^3$ and $10^{20}$ atoms/cm$^3$, and of a second approximately 15 nm-thick silicon layer.

3. The bipolar transistor of claim 1, wherein the metal comprises tungsten deposited on a layer containing titanium or titanium nitride.

4. The bipolar transistor of claim 1, wherein the metal comprises copper deposited on a layer containing tantalum or tantalum nitride.

5. The method of claim 1, wherein the emitter region has a thickness between approximately 5 nm and approximately 30 nm.

6. The method of claim 1, wherein the metal comprises aluminum deposited on a layer comprising tantalum or titanium nitride.

* * * * *